(12) United States Patent
Van Ngo et al.

(10) Patent No.: US 6,329,718 B1
(45) Date of Patent: *Dec. 11, 2001

(54) METHOD FOR REDUCING STRESS-INDUCED VOIDS FOR 0.25M$\mu$ AND SMALLER SEMICONDUCTOR CHIP TECHNOLOGY BY ANNEALING INTERCONNECT LINES AND USING LOW BIAS VOLTAGE AND LOW INTERLAYER DIELECTRIC DEPOSITION RATE AND SEMICONDUCTOR CHIP MADE THEREBY

(75) Inventors: Minh Van Ngo, Union City; Paul R. Besser, Sunnyvale; Matthew Buynoski, Palo Alto; John Caffall, San Carlos; Nick MacCrae, San Jose; Richard J. Huang, Cupertino; Khanh Tran, San Jose, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/105,775

(22) Filed: Jun. 26, 1998

(51) Int. Cl.$^7$ .............................. H01L 23/48; H01L 23/52
(52) U.S. Cl. ........................... 257/765; 257/763; 257/764
(58) Field of Search .................................... 257/758, 759, 257/763, 773, 776, 752, 764, 765; 438/622, 623

(56) References Cited

U.S. PATENT DOCUMENTS

| | | | | |
|---|---|---|---|---|
| 5,332,693 | * | 7/1994 | Kim | 438/648 |
| 5,345,108 | * | 9/1994 | Kikkawa | 257/751 |
| 5,519,250 | * | 5/1996 | Numata | 257/773 |
| 5,563,099 | * | 10/1996 | Grass | 438/632 |
| 5,863,832 | * | 1/1999 | Doyle et al. | 438/622 |

FOREIGN PATENT DOCUMENTS

358046641-A    3/1983    (JP) .

* cited by examiner

Primary Examiner—Steven Loke
Assistant Examiner—Hung Kim Vu
(74) Attorney, Agent, or Firm—LaRiviere, Grubman & Payne, LLP

(57) ABSTRACT

A method for making 0.25 micron semiconductor chips includes annealing the metal interconnect lines prior to depositing an inter-layer dielectric (ILD) between the lines. During annealing, an alloy of aluminum and titanium forms, which subsequently volumetrically contracts, with the contraction being absorbed by the aluminum. Because the alloy is reacted prior to ILD deposition, however, the aluminum is not constrained by the ILD when it attempts to absorb the contraction of the alloy. Consequently, the likelihood of undesirable void formation in the interconnect lines is reduced. The likelihood of undesirable void formation is still further reduced during the subsequent ILD gapfill deposition process by using relatively low bias power to reduce vapor deposition temperature, and by using relatively low source gas deposition flow rates to reduce flow-induced compressive stress on the interconnect lines during ILD formation.

7 Claims, 2 Drawing Sheets

METHOD FOR REDUCING STRESS-INDUCED VOIDS FOR 0.25Mµ AND SMALLER SEMICONDUCTOR CHIP TECHNOLOGY BY ANNEALING INTERCONNECT LINES AND USING LOW BIAS VOLTAGE AND LOW INTERLAYER DIELECTRIC DEPOSITION RATE AND SEMICONDUCTOR CHIP MADE THEREBY

TECHNICAL FIELD

The present invention relates generally to semiconductor fabrication, and more particularly to methods for improving the reliability of 0.25 µM technology semiconductors by alleviating stress in interconnect lines that might otherwise result in the formation of voids in the interconnect lines.

BACKGROUND OF THE INVENTION

Semiconductor chips or wafers are used in many applications, including as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

In chips that hold integrated circuits, the individual circuit components are interconnected by conductive elements referred to as "interconnect lines." These interconnect lines are typically arranged in a multi-layered pattern that is deposited on a semiconductive substrate such as silicon. To insulate the interconnect lines from each other, insulative material is deposited between adjacent interconnect line layers.

With the above in mind, so-called 0.25 micron technology has been developed, in which the distance between adjacent layers of interconnect lines in an integrated circuit on a semiconductor chip is equal to or less than about three-eighths of a micron. With such a small spacing between interconnect lines, which have heights of about 1.1 microns, the size of the circuits on the chip can be reduced to result in the above-noted advantages.

Typically, each electrically conductive interconnect line is made of a "stack" of metal layers that typically includes a layer made of aluminum or aluminum alloy, and one or more other metal layers. The aluminum is deposited as a film over the substrate and is then lithographically patterned and chemically etched to form a desired pattern for the circuit's connector lines. Then, a process referred to as high density plasma (HDP) inter-layer dielectric (ILD) formation is used to fill the gaps between adjacent metal stacks with an electrically non-conductive material. Ordinarily, the ILD deposition step is undertaken at relatively high temperature, incidentally precipitating the formation of an intermetallic structure. In current applications, titanium is commonly used as an underlayer for the aluminum, and the intermetallic structure that forms in such a device is $TiAl_3$. Also, an overlayer that includes TiN anti-reflective coating (ARC) is disposed over the stacks, for lithography purposes.

As understood herein, however, voids caused by hydrostatic stresses undesirably can form in the aluminum, and the voiding of the aluminum can be accelerated by the formation of the intermetallic structure. This is undesirable, because when a void forms in a thin aluminum line, the current path through the line unfortunately is diverted, thereby adversely affecting the reliability of the chip.

The present invention understands that the above-mentioned hydrostatic stresses arise because the thermal expansion coefficient of the aluminum layer is different from the thermal expansion coefficient of the encapsulating ILD and the silicon substrate, both of which mechanically constrain the aluminum. Furthermore, when an intermetallic structure such as $TiAl_3$ is formed, the intermetallic structure can volumetrically contract (by 5.9%, in the case of $TiAl_3$), and the aluminum in the intermetallic structure, which is the most compliant metal in the stack, will consequently absorb the contraction-induced strain and thus have an even higher stress state as a result. Additionally, we have discovered that the undesirable voiding can be accelerated by relatively high compressive stress caused by high silane flow rates of sixty six standard cubic meters per minute (66 SCCM) and higher and relatively high temperatures (caused by applying relatively high bias power of 3500 watts and higher) during ILD deposition.

Fortunately, the present invention recognizes that contrary to previous methods based on larger-geometry chips, in which pre-annealing interconnect lines prior to ILD deposition would have undesirably formed hillocks, i.e., extrusions of metal, in the chip structure, it is possible to anneal the metal stacks prior to ILD deposition in 0.25 µm semiconductors, when only the substrate, and not the ILD, constrains the aluminum in the stacks. As recognized by the present invention, the consequence is that the likelihood of void formation in the interconnect lines is reduced, thereby improving 0.25 µm chip reliability. The present invention moreover understands that relatively low temperatures and silane flow rates during ILD deposition can be used to further reduce the likelihood of void formation in the interconnect lines.

BRIEF SUMMARY OF THE INVENTION

A method is disclosed for making a semiconductor chip having electrically conductive interconnect lines. The method includes providing at least one substrate, and establishing at least one predetermined pattern of electrically conductive interconnect lines on the substrate. In accordance with the present invention, prior to depositing a dielectric layer between the interconnect lines, the lines are annealed, and then the dielectric layer (ILD) is deposited from a source gas with a flow rate of no more than sixty five standard cubic centimeters per minute (65 SCCM).

In a preferred embodiment, the substrate is disposed on a support, and a bias power of no more than three thousand four hundred (3400) Watts is applied to the support. More preferably, the bias power is no more than 3000 Watts. Further, when the source gas is silane, the particularly preferred flow rate of the source gas used to deposit the ILD is maintained at a volume flow rate of less than sixty standard cubic centimeters per minute (60 SCCM), and can be between forty (40) SCCM and 60 SCCM.

As intended by the present invention, each line establishes a stack including at least one layer having aluminum, and an alloy of titanium and aluminum is formed during the annealing step. As disclosed in detail below, the annealing step is undertaken by heating the electrically conductive lines to a temperature of between three hundred fifty degrees Celsius and four hundred fifty degrees Celsius (350° C.–450° C.) for a period of between ten minutes and ninety minutes. If desired, the ILD source gas can be silane or TEOS, and the ILD source gas is deposited by directing ILD source gas onto the lines while simultaneously removing excess ILD material by sputtering. A chip made according to the method, and a computing device incorporating the chip, are also disclosed.

In another aspect, a semiconductor chip includes at least one substrate and at least one predetermined pattern of aluminum lines supported by the substrate. Adjacent lines are separated by distances equal to or less than about three-eighths of a micron. An alloy of aluminum and titanium is formed on the lines, with the alloy being reacted prior to insulating the lines from each other. In accordance with the present invention, the lines are insulated from each other by vapor deposition of an inter layer dielectric (ILD) from a source gas at a volume flow rate of no more than sixty standard cubic centimeters per minute (60 SCCM).

In still another aspect, a method for making a semiconductor chip includes establishing plural electrically conductive lines on at least one substrate. The lines are spaced from each other by distances equal to or less than three-eighths of a micron. The method further includes depositing a dielectric between at least two lines that are adjacent each other using a source gas at a flow rate of no more than sixty five standard cubic centimeters per minute (65 SCCM).

Other features of the present invention are disclosed or apparent in the section entitled: "DETAILED DESCRIPTION OF THE INVENTION."

BRIEF DESCRIPTION OF DRAWINGS

For fuller understanding of the present invention, reference is made to the accompanying drawing in the following detailed description of the Best Mode of Carrying Out the Present Invention. In the drawings.

Figure 1:
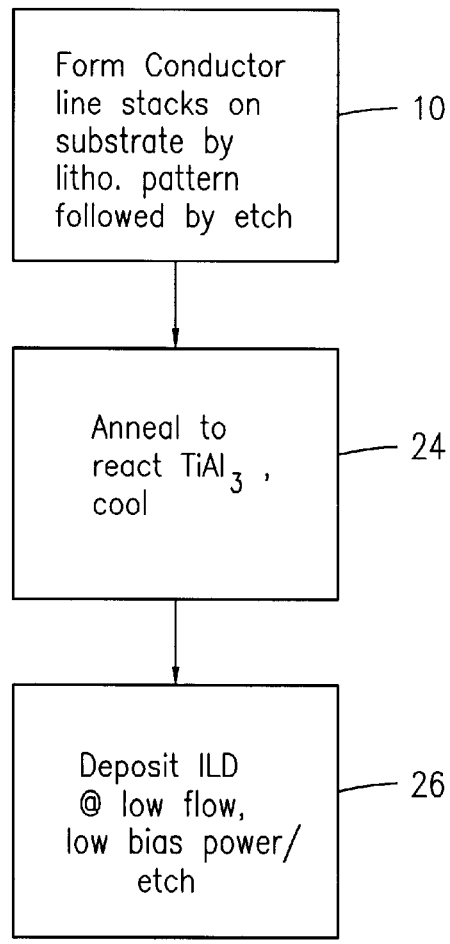
FIG. 1 is a flow chart of the present process for making a 0.25 μm technology semiconductor chip.

Reference numbers refer to the same or equivalent parts of the present invention throughout the several figures of the drawing. In the description, the terms "vertical" and "horizontal" refer to the orientations of the figures shown, for purposes of disclosure, and do not necessarily refer to the orientation of the present wafer once the wafer is embodied in a computing device.

DETAILED DESCRIPTION OF THE INVENTION

Figure 2:
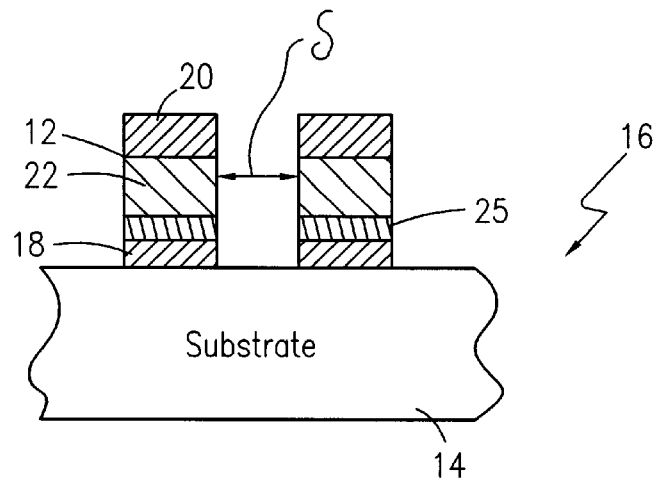
FIG. 2 is a schematic diagram of the substrate showing the chip after conductor line stack formation.

Referring initially to FIGS. 1 and 2, the process of the present invention in producing 0.25 μm technology computer chips can be understood. Commencing at block 10 in FIG. 1 and as shown in FIG. 2, plural stacks 12 are formed on a substrate 14. Each stack 12 is a metallic, electrically-conductive stack that defines a respective interconnect line for an integrated circuit chip, generally designated 16. The chip 16 can establish an integrated circuit such as a microprocessor or a flash memory chip (e.g., an electrically programmable memory (EPROM)) for use in the computer arts. Although only two stacks 12 are shown for clarity of disclosure, it is to be understood that more than two stacks typically are formed on the substrate 14.

Preferably, the substrate 14 includes a semiconductor material such as silicon. Also, the substrate 14 can include a number of devices, such as metal oxide silicon field effect transistor (MOSFET) devices, that are electrically connected to one or more of the stacks 12 via connector plugs.

In the preferred embodiment, each stack 12 includes a respective lower titanium layer 18 abutting the substrate 14, an upper titanium layer 20 parallel to and spaced from the lower titanium layer 18, and an aluminum layer 22 sandwiched therebetween. The titanium layers can be titanium or a titanium alloy such as titanium nitride. It is to be understood that greater or fewer layers can be provided. In a preferred embodiment, the aluminum layer 22 is made of aluminum or an aluminum alloy including aluminum and from 0.1% to about 10% by weight of one or more of copper, nickel, zinc, gold, titanium, indium, chromium, silver, palladium, silicon, and platinum.

The stacks are patterned on the wafer substrate 14 in accordance with means known in the art, e.g., by depositing the various metallic layers as films, covering the films with a mask, and then directing ultraviolet light against the exposed portions of the films. After lithographic patterning, chemical etching is used to remove portions of metal not in the pattern to establish the predetermined pattern of aluminum conductive lines of the chip 16, as shown in FIG. 2.

As can be appreciated in reference to FIG. 2, the chip 16 a so-called 0.25 μm, in that the distance δ between adjacent stacks 12 is about equal to or less than three-eighths of a micron (0.375 μm).

Moving to block 24 in FIG. 1, after forming the stacks 12, the stacks 12 are annealed to form an intermetallic in structure, with an alloy structure 25 being formed at the interface between each layer of aluminum and a layer of titanium (only a single alloy structure 25 shown for clarity of disclosure). In the preferred embodiment, the metal alloy is an alloy of aluminum and titanium, and more specifically is $TiAl_3$. Preferably, the annealing at block 24 is undertaken by heating the stacks 12 to a temperature of between three hundred fifty degrees Celsius and four hundred fifty degrees Celsius (350° C.–450° C.) for a period of between ten minutes and ninety minutes. Also, during the annealing step the stacks 12 are exposed to one or more annealing gases, preferably nitrogen at a volume flow rate of between eleven standard liters per minute and fourteen standard liters per minute (11.0 slm–14.0 slm) and hydrogen at a volume flow rate of between one standard liter per minute and two standard liters per minute (1.0 slm–2.0 slm).

After annealing, the chip 16 is cooled. Accordingly, as provided by the present invention the $TiAl_3$, which would otherwise form during ILD deposition and contract during the subsequent cool down when the stacks 12 are constrained by the ILD, is instead formed prior to ILD deposition, thus permitting the aluminum in the stacks 12 to absorb contraction from the $TiAl_3$ before the stacks 12 are constrained by the ILD. This reduces the likelihood that voids will undesirably form in the interconnect lines of the chip 16.

Figure 3:
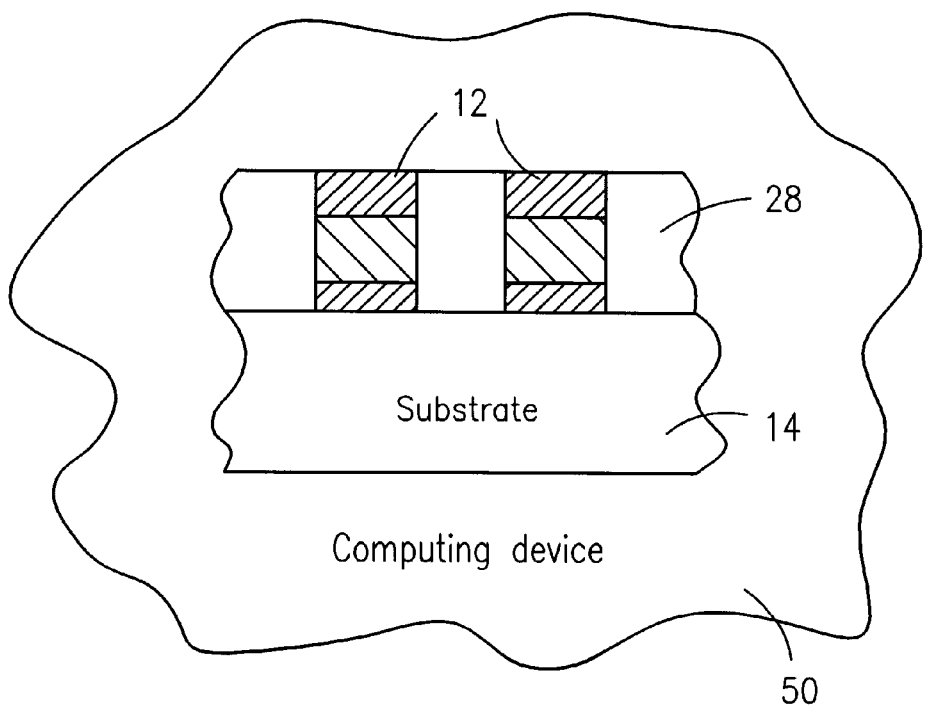
FIG. 3 is a schematic cross-sectional diagram of the substrate showing the chip after ILD deposition/etching, schematically showing a computing device that incorporates the chip.

Moving to block 26 of FIG. 1 and referring to FIG. 3, an interlayer dielectric (ILD) 28 is deposited between the stacks 12 to insulate the stacks 12. While the present invention envisions using any appropriate high density plasma (HDP) ILD source gas such as silane ($(SiH_4)$), tetraethoxy silane $(TEOS, SiLOC_2H_5)_4$ can also be used to avoid the production of free hydrogen that could otherwise embrittle the aluminum.

Figure 4:
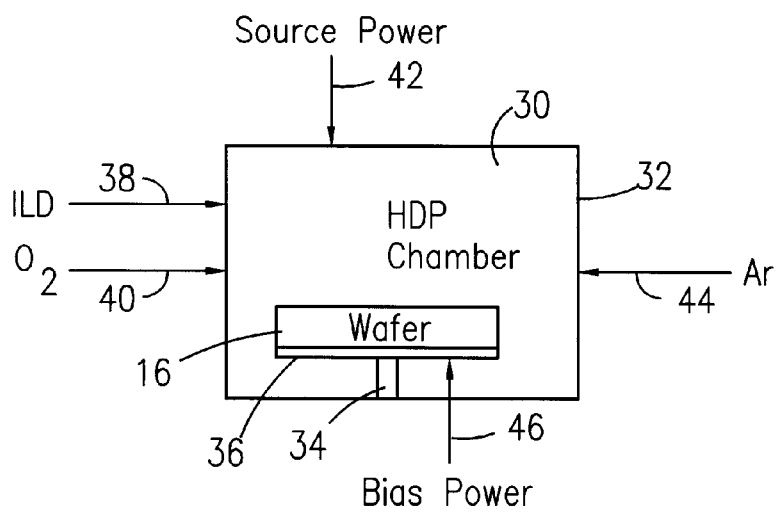
FIG. 4 is a schematic diagram of a high density plasma gap fill deposition chamber.

To understand the preferred embodiment cross-reference is made to FIGS. 3 and 4. A high density plasma (HDP) chamber 30 (FIG. 4) is enclosed by a wall 32. A support 34 is disposed in the chamber 30, and the support 34 may include an e-chuck 36. One or more chips 16 are in turn disposed on the e-chuck 36.

To provide for depositing ILD on the chips 16, a source gas inlet 38 and an oxygen inlet 40 are associated with the chamber wall 32 to respectively direct a source gas (such as silane) and oxygen into the chamber 30, and a source power lead 42 is likewise associated with the chamber 30. In the preferred embodiment, a source gas such as silane is directed into the chamber 30 at a volume flow ranging from 40 standard cubic centimeters per minute (SCCM) to sixty five standard cubic centimeters per minute (65 SCCM), and more preferably at a volume flow rate of no more than 60 SCCM. In contrast, oxygen is directed into the chamber 30 at a rate ranging from one hundred ten standard cubic centimeters per minute to one hundred thirty standard cubic centimeters per minute (110 SCCM–130 SCCM). The pressure within the chamber 30 is maintained between one milliTorr and six milliTorr (1 mTorr-6 mTorr), and the source power applied to the chamber 30 is between two thousand watts and five thousand watts (2000 W–5000 W). In accordance with the present invention, the solid ILD is subsequently established from the source gas that is deposited by vapor deposition as described.

To provide for simultaneous sputtering of the ILD while it is being deposited, an etchant inlet 44 is associated with the wall 32 to port a gaseous sputtering agent, preferably argon, into the chamber 30. Also, a bias power lead 46 is connected to the e-chuck 36, and bias power is maintained at no more than three thousand four hundred watts (3400 W), and more preferably at no more than 3000 Watts.

If desired, both the annealing step and the subsequent ILD deposition step can be undertaken in the chamber 30. If the annealing step is to be undertaken in the chamber 30, nitrogen and hydrogen inlets (not shown) are provided in the chamber 30.

The completion of the chip 16 may proceed in any such manner as is required by its design. The resulting chip 16 can be incorporated into a computing device 50 (FIG. 3), e.g., a computer, digital camera, wireless telephone, or hand held computer, for use by the computing device 50.

The principles of the present invention are equally applicable to a wide range of semiconductor and integrated circuit design and manufacture regimens, including but not necessarily limited to the production of non-volatile memory devices. All such implementations are specifically contemplated by the principles of the present intention.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims, in which reference to an element in the singular is not intended to mean "one and only one" unless explicitly so stated, but rather "one or more". The inventions illustratively disclosed herein may be practiced without any element which is not specifically disclosed herein.

What is claimed is:

1. A semiconductor chip, comprising:
   at least one substrate;
   at least one predetermined pattern of at least one conductive interconnect line supported by the at least one substrate, adjacent lines being separated by a distance in a range of equal to or less than about three-eighths of a micron ($\leq 0.375$ $\mu$m, said at least one line comprising at least one first layer made of titanium, at least one second layer comprising aluminum, and at least one intermetallic layer formed and disposed between the at least one first layer and the at least one second layer;
   an interlayer dielectric (ILD) formed and disposed between said adjacent lines; and
   at least a portion of said at least one intermetallic layer comprising an interfusion between a surface of said at least one aluminum laye and a surface of said at least one titanium layer without said at least one aluminum layer being subjected to hydrostatic stress from said ILD,
      wherein said at least one aluminum layer comprises at least one metal additive selected from a group consisting essentially of copper (Cu), nickel (Ni), zinc (Zn), gold (Au), titanium (ji), indium (In), chromium (Cr), silver (Ag), palladium (Pd), silicon (Si), and platinum (Pt) in a range of 0.1 to 10 weight %, and
      wherein said at least one aluminum layer exhibits reduced void formation as a result of said interfusion without said at least one aluminum layer being subjected to hydrostatic stress from said ILD.

2. A semiconductor chip, as recited in claim 1, wherein said at least one intermetallic layer further comprises titanium aluminide ($TiAl_3$).

3. A semiconductor chip, comprising:
   at least one substrate;
   at least one predetermined pattern of at least one spaced-apart electrically conductive interconnect line supported by the at least one substrate, said at least one interconnect line comprising at least one first layer made of titanium, at least one second layer comprising aluminum, and at least one intermetallic layer formed and disposed between the at least one first layer and the at least one second layer;
   an inter-layer dielectric (ILD) formed and disposed between at least two adjacent electrically conductive interconnect lines; and
   at least a portion of said at least one intermetallic layer comprising an interfusion between a surface of said at least one aluminum layer and a surface of said at least one titanium layer without said at least one aluminum layer being subjected to hydrostatic stress from said ILD;
      wherein said at least one aluminum layer comprises at least one a metal additive selected from a group consisting essentially of copper (Cu), nickel (Ni), zinc (Zn), gold (Au), titanium (Ti), indium (In), chromium (Cr), silver (Ag), palladium (Pd), silicon (Si), and platinum (Pt) in a range of 0.1 to 10 weight %, and
      wherein said at least one aluminum layer exhibits reduced void formation as a result of said interfusion without said at least one aluminum layer being subjected to hydrostatic stress from said ILD.

4. A semiconductor chip, as recited in claim 3, wherein adjacent electrically conductive interconnect lines are separated by a spacing in a range of equal to or less than approximately three-eighths of a micron ($\leq 0.375$ $\mu$m).

5. A semiconductor chip, as recited in claim 3, wherein said at least one intermetallic layer comprises titanium aluminide ($TiAl_3$).

6. A semiconductor chip, comprising:
   at least one substrate;
   at least one predetermined pattern of at least one spaced-apart electrically conductive interconnect line supported by the at least one substrate, wherein adjacent electrically conductive interconnect lines are separated by a spacing in a range of equal to or less than approximately three-eighths of a micron ($\leq 0.375$ μm), and wherein said at least one electrically conductive interconnect line includes a stack comprising at least one first layer made of titanium, at least one second layer made of aluminum, and at least one intermetallic layer formed and sandwiched between the at least one first layer and the at least one second layer;

an inter-layer dielectric (ILD) between sad adjacent lines;

at least a portion of said at least one intermetallic layer comprising an interfusion between a surface of said at least one aluminum layer and a surface of said at least one titanium layer without said at least one aluminum layer being subjected to hydrostatic stress from said ILD, wherein said at least one aluminum layer comprises at least one metal additive selected from a group consisting essentially of copper (Cu), nickel (Ni), zinc (Zn), gold (Au), titanium (Ti), indium (In), chromium (Cr), silver (Ag), palladium (Pd), silicon (Si), and platinum (Pt) in a range of 0.1 to 10 weight %, and wherein said at least one aluminum layer exhibits reduced void formation as a result of said interfusion without said at least one aluminum layer being subjected to hydrostatic stress from said ILD.

7. A semiconductor chips as recited in claim 6, wherein said at least one intermetallic layer comprises titanium aluminide ($TiAl_3$).

* * * * *

UNITED STATES PATENT AND TRADEMARK OFFICE
CERTIFICATE OF CORRECTION

PATENT NO. : 6,329,718 B1
DATED : December 11, 2001
INVENTOR(S) : Minh Van Ngo, Paul R. Besser, Matthew Buynoski, John Caffall, Nick MacCrae, Richard J. Huang and Khanh Tran It is certified that error appears in the above-identified patent and that said Letters Patent is hereby corrected as shown below:

Title page, Item [54], and Column 1,
Please delete [0.25Mµ] and replace with -- 0.25µm --;

Column 1,
Line 13, delete [0.25µM] and replace with --0.25µm --;

Column 4,
Line 59, delete [(TEOS, SiLOC$_2$H$_5$)$_4$] and replace with -- (TEOS, Si (OC$_2$H$_5$))$_4$ --;

Column 5,
Line 12, after the words "at a" add -- volume flow --;

Column 5, claim 1,
Line 65, after the word "µm" add -- ) --;

Column 6, claim 1,
Line 8, delete [laye] and replace with -- layer --;
Line 15, delete [(ji)] and replace with -- (Ti) --;

Column 7, claim 6,
Line 10, delete [sad] and replace with -- said --;

UNITED STATES PATENT AND TRADEMARK OFFICE
CERTIFICATE OF CORRECTION

PATENT NO. : 6,329,718 B1
DATED : December 11, 2001
INVENTOR(S) : Minh Van Ngo, Paul R. Besser, Matthew Buynoski, John Caffall, Nick MacCrae, Richard J. Huang and Khanh Tran It is certified that error appears in the above-identified patent and that said Letters Patent is hereby corrected as shown below:

<u>Column 8, claim 7,</u>
Line 13, after the word "layer" add -- further --.

Signed and Sealed this

Nineteenth Day of March, 2002

Attest:

JAMES E. ROGAN
*Director of the United States Patent and Trademark Office*

*Attesting Officer*

UNITED STATES PATENT AND TRADEMARK OFFICE
CERTIFICATE OF CORRECTION

PATENT NO. : 6,329,718 B1
DATED : December 11, 2001
INVENTOR(S) : Minh Van Ngo et al.

It is certified that error appears in the above-identified patent and that said Letters Patent is hereby corrected as shown below:

<u>Title page,</u>
Item [12], delete [Van Ngo et al.] and replace with -- Ngo et al. --.

Signed and Sealed this

Twenty-first Day of May, 2002

Attest:

*Attesting Officer*

JAMES E. ROGAN
*Director of the United States Patent and Trademark Office*